(12) United States Patent
Kropelnicki et al.

(10) Patent No.: US 8,569,857 B2
(45) Date of Patent: Oct. 29, 2013

(54) DIODE BOLOMETER AND METHOD FOR PRODUCING A DIODE BOLOMETER

(75) Inventors: Piotr Kropelnicki, Cologne (DE); Marco Russ, Oberhausen (DE); Holger Vogt, Muelheim (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 42 days.

(21) Appl. No.: 12/963,946

(22) Filed: Dec. 9, 2010

(65) Prior Publication Data
US 2011/0140224 A1 Jun. 16, 2011

Related U.S. Application Data

(63) Continuation of application No. PCT/EP2008/004589, filed on Jun. 9, 2008.

(51) Int. Cl.
*H01L 31/06* (2012.01)

(52) U.S. Cl.
USPC .......... 257/461; 257/436; 257/E31.093; 257/E31.128; 438/57; 438/73

(58) Field of Classification Search
USPC .......... 257/436, 461, E31.093, E31.128; 438/57, 73
See application file for complete search history.

(56) References Cited

U.S. PATENT DOCUMENTS

| | | | |
|---|---|---|---|
| 5,977,603 A | 11/1999 | Ishikawa | |
| 6,483,111 B1 | 11/2002 | Ishikawa | |
| 2009/0084958 A1* | 4/2009 | Vogt | 250/338.4 |
| 2011/0002359 A1* | 1/2011 | Benzel et al. | 374/178 |

FOREIGN PATENT DOCUMENTS

| | | |
|---|---|---|
| DE | 196 33 849 A1 | 6/1997 |
| DE | 10 2006 028435 A1 | 12/2007 |
| WO | WO 2007/104328 A | 9/2007 |
| WO | WO 2007104328 A1 * | 9/2007 |
| WO | WO 2007/147663 A1 | 12/2007 |
| WO | WO 2007147663 A1 * | 12/2007 |

OTHER PUBLICATIONS

Niklaus, Frank et al., "MEMES-Based Uncooled Infrared Bolometer Arrays—A Review", XP-002586083; SPIE Proceedings, The International Society for Optical Engineering—SPIE, Bellingham, Washington, USA, ' Bd. 6836, Nov. 12, 2007, Seiten 68360D-1; ISSN:0277-786X, DOI: 10.117.12.755128.

\* cited by examiner

*Primary Examiner* — Marvin Payen
(74) *Attorney, Agent, or Firm* — Michael A. Glenn; Perkins Coie LLP

(57) ABSTRACT

A bolometer has a semiconductor membrane having a single-crystalline portion, and spacers so as to keep the semiconductor membrane at a predetermined distance from an underlying substrate. The complementarily doped regions of the single-crystalline portion form a diode and the predetermined distance corresponds to a fourth of an infrared wavelength.

16 Claims, 7 Drawing Sheets

DIODE BOLOMETER AND METHOD FOR PRODUCING A DIODE BOLOMETER

CROSS-REFERENCE TO RELATED APPLICATIONS

This application is a continuation of copending International Application No. PCT/EP2008/004589, filed Jun. 9, 2008, which is incorporated herein by reference in its entirety.

BACKGROUND OF THE INVENTION

The present invention relates to a diode bolometer and to a method for producing a diode bolometer and, in particular, to a diode bolometer exhibiting reduced thermal coupling and to a method for producing of high alignment tolerance.

Detecting infrared radiation is increasing in importance in many different fields. For the automobile industry, this importance is achieving an increase in the security of, for example, pedestrians who can be made visible using infrared sensors also in dark environments. When coupling an automatic brake system to sensor technology, accidents can be avoided or at least the consequences thereof be reduced. Further applications of infrared sensors exemplarily include examining technical apparatuses (such as, for example, electrical lines or circuit boards) or buildings. Medical applications may also become relevant in the future. Infrared sensors are already employed in the field of monitoring buildings, areas and frontiers.

The achievable resolution of minimum temperature differences is an important criterion for the quality of the measuring instrument used in many of these applications. This sensitivity is, in commercial apparatuses, frequently indicated as NETD (noise equivalent temperature difference), wherein values of, for example, below 100 mK in temperature difference are achieved in uncooled bolometers. The designation of this characteristic quantity also explains the internal limits of sensors given by the noise features of the system used. When, for example as detector material, a thin membrane is used as a sensor, the membrane heating up under the influence of infrared radiation and thus altering its electrical resistance, the electrical features of said system determine which changes in resistance (and thus temperature) can still be detected and separated from the noise background. When the alteration in the resistance of the material induced by the change in temperature is smaller than the noise of the electrical parameters, it will no longer be resolved.

In many homogenous amorphous sensor materials (such as, for example, silicon, vanadium oxide, etc.), the percentage change in resistance is proportional to the change in temperature. The constant of proportionality here is basically determined by the material selected and the process parameters, wherein generally there are tight limits for optimization. Typical values of the change in resistance are in a range of roughly 2 to 3% per K.

When the change in resistance is determined by the features of the sensor material, two other basic ways of acting on the sensor features on a larger scale remain. A first way is making the sensor elements to be as large as possible. The greater the area available for the sensor and the thermal insulation regions thereof, the more radiation can be absorbed and the more radiation energy will be transformed to an increase in temperature of the sensor. However, this approach is of the decisive disadvantage that the increasing demand for miniaturization and, thus, making the devices cheaper, cannot be taken into account.

When the aim is optimizing the signal-to-noise ratio with a constant size for cost reasons, noise minimization remains as another approach. In electronic devices, there are different noise sources. In amorphous materials, the so-called 1/f noise, where the noise power density is inversely proportional to the frequency f, is usually predominant. This represents a serious problem in that the integrative read-out circuits conventionally used (low pass), for example, are not suitable for suppressing predominant low-frequency noise portions.

A way of bypassing this problem is using a single-crystalline material, such as, for example, silicon. In materials of this kind, the 1/f noise is usually not predominant and a good signal-to-noise ratio can be achieved by integrating the measuring signal. However, this advantage usually entails a greatly reduced dependence of the resistance on the temperature. The temperature dependence of the resistance value may exemplarily have a value of 0.3% per K.

For this reason, it may also be of advantage to use single-crystalline diodes as infrared sensors. An ideal diode exhibits an exponential temperature dependence of the resistance and noise is determined by shot noise which can be limited by a suitable integration time.

Shot noise essentially depends only on the frequency bandwidth of the measurement and a $1/f^2$ dependence only becomes evident with higher frequencies. Thus, diodes are very promising sensor elements since they are able to combine a great signal and low noise.

However, integrating thermally insulating diodes in a CMOS process is complicated. The approach used at first of manufacturing insulated diodes directly in the CMOS wafer by means of suitable under-etchings is of disadvantage in that it consumes large areas—without combining useful insulation and absorption features.

These techniques, for example, do not allow integrating active CMOS driving and amplifying elements below the sensor structure. The potential integration of these elements laterally beside the detector results in a marked reduction of the filling factor (detector area relative to total area) and, thereby, increases the chip area and detector costs. Additionally, it is not possible to produce, using these structures, an absorber comprising a resistance layer having a layer or sheet resistance of roughly 377 Ohm/□ (approximate spreading resistance of an electromagnetic wave in air) and being at the same time arranged at an altitude of λ/4 (i.e. approx. 2.5 µM with a preferred IR wavelength λ) above a reflector.

SUMMARY

According to an embodiment, a bolometer array having pixel elements arranged in columns and rows, each one thereof forming a bolometer, may have: an underlying substrate; a semiconductor membrane per pixel element, having a single-crystalline portion, wherein complementarily doped regions of the single-crystalline portion form a diode and a p-n junction extends between same along a column direction, pixel elements neighboring in the column direction exhibiting equal doping profiles; and a first and a second spacer per pixel element so as to keep the semiconductor membrane at a predetermined distance from the underlying substrate, wherein the predetermined distance corresponds to a fourth of an infrared wavelength, wherein a first and a second edge region via which the semiconductor membrane contacts the spacers and which comprise lands for thermal insulation of the semiconductor membrane, follow the complementarily doped regions laterally on both sides of the p-n junction in each pixel element, and wherein the bolometer additionally comprises an evaluating circuit for each pixel element and at least part of the evaluating circuit is arranged in the underlying substrate laterally between the first and second spacers.

According to another embodiment, a method for producing a bolometer array comprising pixel elements arranged in columns and rows, each one thereof forming a bolometer, may have the steps of: forming a semiconductor membrane comprising a single-crystalline portion per pixel element using complementarily doping regions of the single-crystalline portion of each pixel element so that the complementarily doped regions form a diode and a p-n junction extends between same along a column direction, pixel elements neighboring in a column direction exhibiting equal doping profiles; forming a bond layer on the semiconductor membrane; providing a circuit substrate which comprises an evaluating circuit for each pixel element; bonding the semiconductor membrane and the circuit substrate along the bond layer; forming a first and a second spacer per pixel element to keep, after removing the bond layer, the semiconductor membrane at a predetermined distance from the underlying substrate so that part of the evaluating circuit is arranged in the underlying substrate laterally between the first and second spacers for each pixel element, the predetermined distance corresponding to a fourth of an infrared wavelength, patterning the semiconductor membrane so that a first and a second edge region via which the semiconductor membrane contacts the spacers and which comprise lands for thermal insulation of the semiconductor membrane, follow laterally to the complementarily doped regions at both sides of the p-n junction in each pixel element; and removing the bond layer.

According to another embodiment, a bolometer may have: an underlying substrate; a semiconductor membrane comprising a single-crystalline portion; and a spacer so as to keep the semiconductor membrane at a predetermined distance from the underlying substrate, wherein complementarily doped regions of the single-crystalline portion form a diode and the predetermined distance corresponds to a fourth of an infrared wavelength, wherein the semiconductor membrane contacts the spacers via a first and a second edge region which comprise lands for thermal insulation of the semiconductor membrane, wherein the first and second edge regions comprise an amorphized doped semiconductor material, and wherein the bolometer additionally comprises an evaluating circuit and at least part of the evaluating circuit is arranged in the underlying substrate laterally between the first and second spacers.

According to still another embodiment, a method for producing a bolometer may have the steps of: forming a semiconductor membrane comprising a single-crystalline portion using complementarily doping regions of the single-crystalline portion such that the complementarily doped region forms a diode; forming a bond layer on the semiconductor membrane; providing a circuit substrate comprising an evaluating circuit; bonding the semiconductor membrane and the circuit substrate along the bond layer; forming a first and a second spacer so as to keep, after removing the bond layer, the semiconductor membrane at a predetermined distance from the underlying substrate such that part of the evaluating circuit is arranged in the underlying substrate laterally between the first and second spacers, the predetermined distance corresponding to a fourth of an infrared wavelength, patterning the semiconductor membrane such that the semiconductor membrane contacts the first and second spacers via a first and a second edge region; amorphizing the first and second edge regions; and removing the bond layer.

The central idea of the present invention is providing a bolometer comprising a semiconductor membrane having a single-crystalline portion, complementarily doped regions of the single-crystalline portion forming a diode. The membrane obtained in this way is kept at a predetermined distance in front of an underlying substrate by means of spacers, wherein those areas of the membrane where the spacers fix the membrane are amorphized so that thermal conductivity in these areas is decreased. In order to increase electrical conductivity along the amorphous regions, optionally an additional conductive layer may be arranged along the membrane. The conductive layer may at the same time be used for adjusting the sheet resistance of the membrane correspondingly—such as, for example, in a region between 200 and 700 Ohm/square area or, for example, to the spreading resistance of the electromagnetic wave in air.

The present invention is also based on the finding that a method for producing a bolometer includes processing a sensor wafer and processing a circuit wafer, wherein both wafers are bonded to each other after being processed. This allows the high-temperature processes needed when processing the sensor wafer to neither destroy nor negatively influence a circuit arranged in the substrate below the membrane.

This way of at first manufacturing the read-out circuit and the diodes in different wafers and subsequently combining the two wafers by so-called wafer-to-wafer bonding causes a large number of advantages since this, among other things, allows achieving a high filling factor with, at the same time, low alignment tolerance.

In the simplest case, the sensor wafer bonded to the circuit electronics thus comprises only a single layer made of a differently doped semiconductor material, such as, for example, silicon. Since, however, in this case neither the optical nor the electrical parameters are optimal, further modifications are practical. One aim here is modifying the simple diode structure such that the sensor (infrared sensor) absorbs a large part of the incident radiation and the energy absorbed results in a maximum increase in temperature and the resulting change in the measuring signal becomes as great as possible.

This allows embodiments to solve a number of problems. Using the process procedure presented here, it becomes possible to use single-crystalline diodes for infrared detection, without at the same time having to put up with losses in thermal insulation or optical features. While the sensor itself is of a single-crystalline nature, thermal coupling takes place via amorphous regions which conduct heat poorly. In the process procedure for producing diodes, too, the limitations necessary so far can also be eliminated since the diodes are not formed in a sensitive CMOS wafer, but in a separate sensor wafer which is combined with the CMOS wafer by bonding after being processed.

Thus, the invention achieves the following improvements:
  diodes made of a single-crystalline semiconductor material may be used as detectors, which allows achieving low noise;
  excellent thermal insulation is achieved, for example, by the amorphized contacts;
  excellent optical features;
  low thermal mass and, thus, small time constants;
  good electrical features (caused by a relatively small resistance); and
  scalable geometries (since the evaluating circuit, for example, may be arranged below the membrane).

Compared to embodiments of the present invention, conventional bolometers comprising diodes have been realized in a method such that the bolometers exhibit a large time constant, little insulation and only poor absorption behavior. Diodes below the membrane, for example, are arranged such that no $\lambda/4$ absorbers may be realized—at least not an absorber in which the membrane is suspended at a distance of roughly 2.5 µm above an underlying background. However, this value would correspond to an IR wavelength usually to be detected of λ~10 µm (in a body at ambient temperature).

Embodiments also include a method for producing a single-crystalline diode bolometer exhibiting reduced thermal coupling, wherein the following process steps may be performed for producing the bonded diode bolometer which exhibits optimized thermal, electrical and optical features.

At first, a wafer having the read-out circuit (ROIC=read out integrated circuit) is processed. In those regions where the electrical contact to the sensor wafer will be produced later on, this wafer comprises contact areas. The read-out circuit may be particularly simple since the diodes themselves already represent a switch which may be used for addressing.

In a second step, another wafer (sensor wafer) having the diode bolometers arranged to form an array may be produced. A so-called SOI (silicon on insulator) wafer may exemplarily be used as the substrate. However, using an SOI wafer is optional and alternatively other wafers may correspondingly also be used. The SOI wafer is characterized by the fact that, on a thick silicon layer, there is a layer made of oxide (buried oxide layer) followed by another layer made of single-crystalline silicon.

Using an exemplary LOCOS (local oxidation of silicon) process, the wafer may exemplarily be divided into two regions comprising single-crystalline silicon of different thicknesses. The thicker region may exemplarily form the sensor layer later on and allows a higher current flow, whereas the thin regions (contact regions) allow optimized thermal insulation.

After further oxidation (such as, for example, scattering oxide), the doping profile (n-type and p-type regions) may be implanted and annealed thermally. The thin contact regions may then be amorphized by being bombarded with a non-doping material, such as, for example, argon. After some further steps, a thin conductive material which may exemplarily comprise titanium nitride may be deposited on large parts of the detector. This avoids reflections and, at the same time, electrically bridges electrically poorly conducting regions of the amorphized silicon. The layer sequence may then, optionally, be provided with a suitable passivation.

Since the contact regions are amorphized and are thinner than the actual sensorically active regions, thermal decoupling of the sensor region can be achieved. The sensor region itself at the same time remains of a single-crystalline nature and thus exhibits markedly improved noise features compared to completely amorphous sensor materials.

The further process procedure may then be dependent on the technique selected for connecting the two wafers. In one process procedure, the sensor is provided with a silicon oxide and then connected to the circuit wafer comprising the read-out circuit directly in a wafer bonder. The substrate for the sensor wafer no longer required is then removed from the bonded wafers, which may exemplarily be performed by a so-called grinding process with final chemical etching down to the buried oxide layer. This buried oxide may then also be removed completely and be replaced by a passivation layer which may be selected as desired. This passivation layer, for example, is then patterned such that the regions above the contact regions of the ROIC are exposed.

Holes which are subsequently filled with a metal may be etched down to the contact areas of the ROIC in another etching step. Finally, in another etching process, the sensor geometry may be produced (exemplarily defining the individual bolometer pixels). The intermediate layers no longer required may then be removed chemically. When, exemplarily, the intermediate layers are made of silicon oxide, an HF vapor, for example, may be used for etching.

There are a number of further methods, such as, for example, using sticky intermediate layers (such as, for example, polyamide), for connecting (bonding) the two wafers (circuit wafer and sensor wafer).

Thus, embodiments describe a single-crystalline diode bolometer exhibiting reduced thermal coupling, wherein the single-crystalline nature of the membrane ensures an excellent signal-to-noise ratio and ensures reduced thermal coupling by amorphized edge regions where the membrane is fixed.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
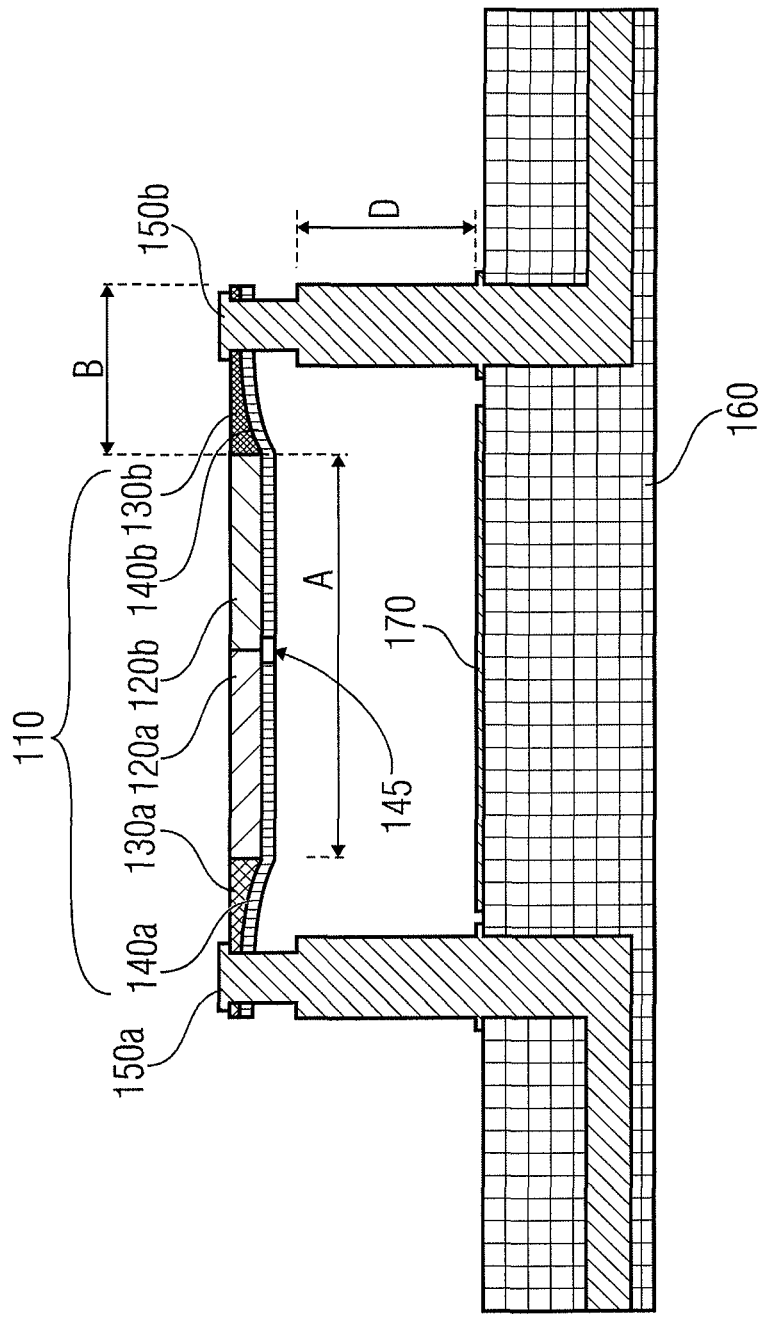
FIGS. 1a,b show cross-sectional views of a diode bolometer in accordance with embodiments of the present invention.

Before discussing the present invention in greater detail below referring to the drawings, it is pointed out that same elements in the figures are provided with same or similar reference numerals and that a repeated description of these elements is omitted.

FIG. 1a shows a cross-sectional view of a bolometer in accordance with an embodiment of the present invention, the bolometer comprising a semiconductor membrane 110 which is kept at a certain distance D from an underlying substrate 160 by two spacers 150a, b. The semiconductor membrane 110 comprises a single-crystalline portion 120, complementarily doped regions 120a, b of the single-crystalline portion 120 forming a diode. Additionally, the semiconductor membrane 110 comprises a first amorphized region 130a which is in connection with the first spacer 150a, and a second amorphized region 130b which is in contact with the second spacer 150b. A conductive layer 140 is formed on that side of the membrane 110 facing the underlying substrate 160, the conductive layer 140 in turn comprising a first part 140a which is in electrical contact with the first spacer 150a, and a second part 140b in conductive contact with the second spacer 150b. The first and second parts of the conductive layer 140a, b are electrically insulated from each other by a gap 145, the first part of the conductive layer 140a electrically contacting the first doped region 120a and the second part of the conductive layer 140b electrically contacting the second doped region 120b. The spacers 150a, b define, on the one hand, the predetermined distance D of the membrane 110 above the underlying substrate 160 and, additionally, the spacers 150 offer mechanical support and also electrical contacting of the membrane 110.

In order to achieve improved thermal insulation or shielding of the sensor region A defined by the doped regions 120a, b, contact regions B around the spacers 150 are formed, wherein the contact regions B may exemplarily be generated by amorphizing single-crystalline semiconductor material. In order to realize a most efficient infrared sensor possible, it is of advantage to choose the predetermined distance D such that the result is a λ/4 absorber, i.e. that the predetermined distance D corresponds to a fourth of an infrared wavelength (D=λ/4). In order to realize a λ/4 absorber, additionally a reflection layer 170 is formed on the underlying substrate 160 such that infrared waves incident and reflected by the reflection layer 170 may be absorbed efficiently, resulting in the membrane 110 heating up. The heating of the membrane 110 as a result of the absorption of the incident infrared radiation may then be measured by a change in the electrical resistance along the p-n junction of the complementarily doped regions 120a and 120b. For this purpose, an evaluating circuit 180 (not shown in FIG. 1a) may exemplarily be arranged in the underlying substrate 160.

The conductive layer 140, on the one hand, serves improved contacting of the complementarily doped regions 120a, b (since the conductivity of the contact regions B is diminished by amorphization) and adjusting the layer resistance of the membrane 110 which should optimally correspond to the characteristic impedance of air (i.e. roughly 377 Ohm/sq.). Silicon may exemplarily be used as the semiconductor material and the complementarily doped regions may be obtained by boron or phosphorous implantation (the result being an n-conducting and a p-conducting area).

Figure 1B:
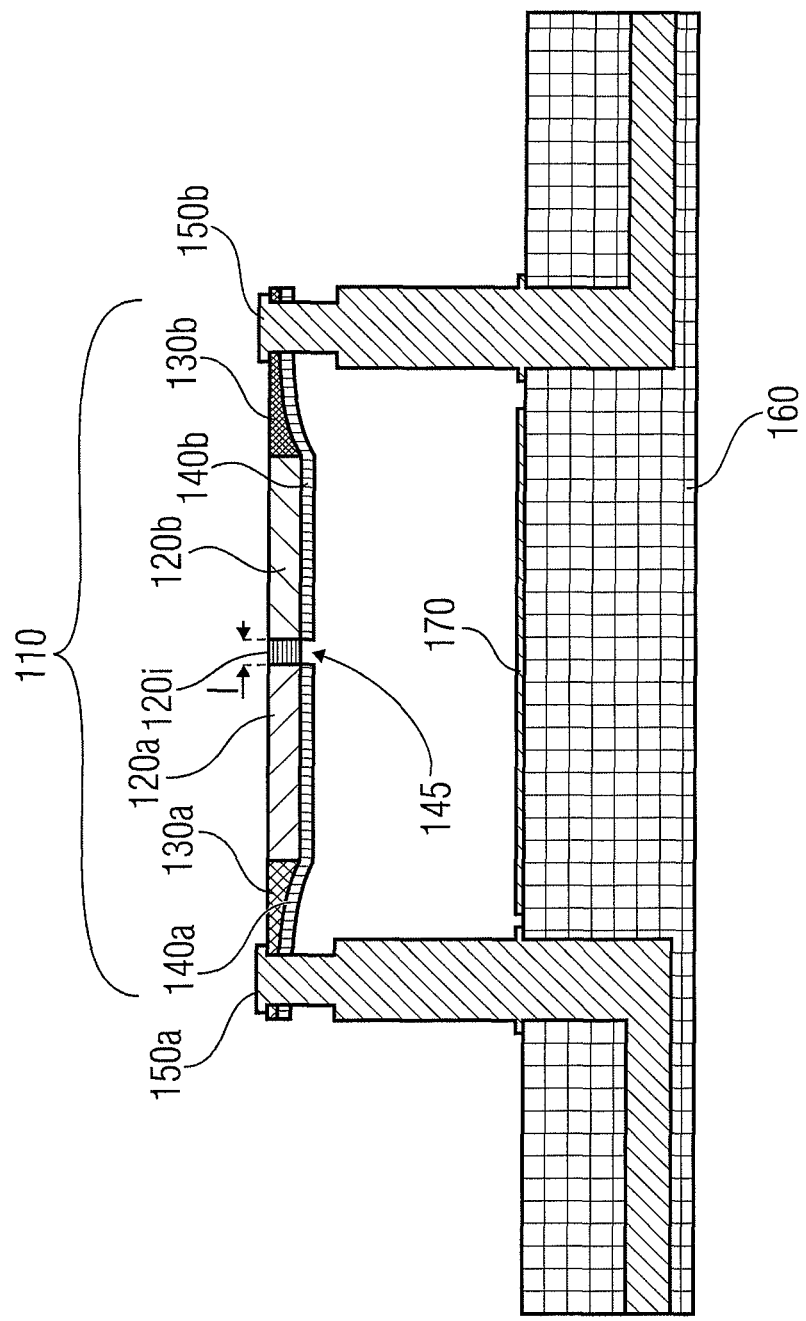

FIG. 1b shows a cross-sectional view of a bolometer in accordance with another embodiment, the bolometer again comprising a semiconductor membrane 110, wherein, in contrast to the semiconductor membrane 110 of FIG. 1a, an intrinsic portion 120i is formed between the complementarily doped regions 120a, b. The intrinsic portion 120i has no, or weak (p-type or n-type) doping and is exemplarily formed of the same semiconductor material as the single-crystalline portion 120. The intrinsic portion 120i may exemplarily be formed above or along the gap 145, the gap 145 in turn electrically insulating the first and second parts of the conductive layer 140a, b from each other. The intrinsic portion 120i may thus be formed laterally along the entire semiconductor membrane 110 so that an electrical current flowing between the first and second spacers 150a, b passes the intrinsic portion 120i. Perpendicularly to the potential current flow, the intrinsic portion 120i comprises a lateral extension I which may be selected such that a PIN diode forms along the semiconductor membrane 110. If the intrinsic portion 120i is weakly p-type doped or weakly n-type doped, the intensity of this doping should be considerably below that of the doping of the complementarily doped regions 120a, b (exemplarily at least below 10% or less than 1%).

All other features of the embodiment as is shown in FIG. 1b are identical to those in the embodiment of FIG. 1a, a repeated description being omitted here.

Further embodiments also include a bolometer in which the sensory active part is implemented as a diode comprising at least two complementarily (p-type or n-type) doped regions 120a, b, wherein optionally one or several regions of reduced dopant concentration are formed between them.

FIGS. 2a to 2f show a potential process procedure for the sensor wafer which will basically define the membrane 110 later on.

Figure 2A:
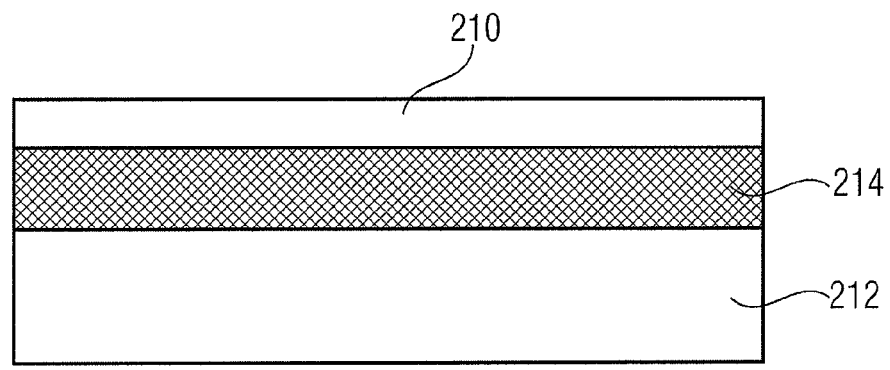
FIGS. 2a-2f show cross-sectional views of a process sequence of the sensor wafer.

FIG. 2a exemplarily shows a so-called SOI substrate as a potential basis for the sensor wafer. The SOI substrate exemplarily comprises a single-crystalline silicon layer 210 which is separated from a substrate (such as silicon substrate) 212 by an oxide layer 214. The single-crystalline silicon layer 210 will later on form the active sensor layer, the oxide layer 214 being also referred to as buried oxide. The process procedure discussed in greater detail below using an SOI wafer here is only exemplary, wherein other single-crystalline semiconductor materials or other semiconductor wafers may be employed equally.

Figure 2B:
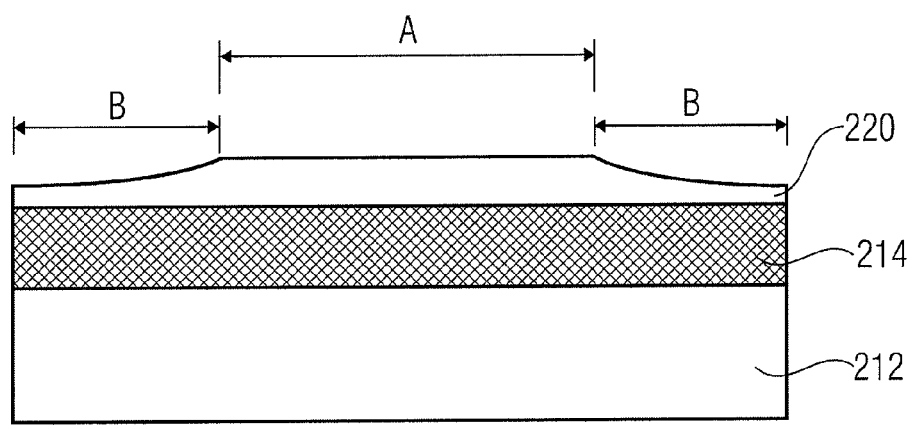

FIG. 2b shows how the sensor region A is defined along the single-crystalline semiconductor layer 210 by thinning the single-crystalline silicon layer 210 along the contact regions B (edge regions), the result being the semiconductor layer 220. Thinning may exemplarily be performed by a so-called LOCOS (local oxidation of silicon) process on the edge regions B of the future sensor. Thinning of this kind at the same time decreases thermal conductivity of the edge regions B, the result being improved thermal insulation relative to the spacers 150 in the future sensor.

Figure 2C:
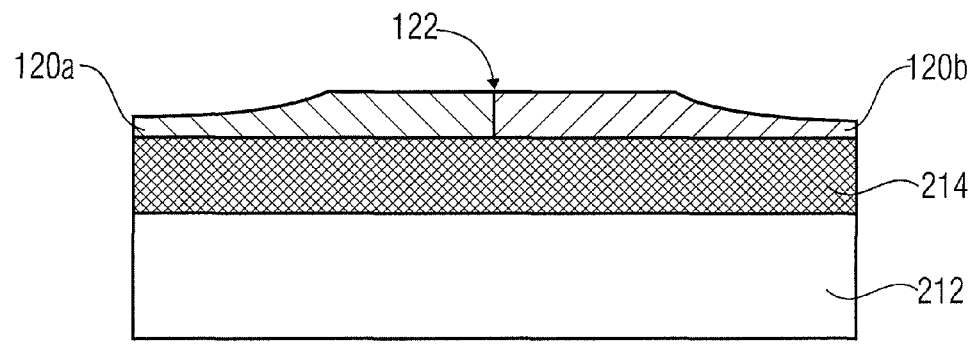

FIG. 2c shows how the first doped region 120a and the second doped region 120b can be formed by doping the semiconductor layer 220, the two doped regions 120a, b being of complementary doping, the result being a p-n junction at the boundary layer 122. The doping in the first region 120a may exemplarily be performed by boron implantation, thereby making the semiconductor material n-conducting (n-silicon), and doping of the second region 120b may exemplarily be performed by phosphorous implantation, a p-conducting semiconductor (p-silicon) resulting from this. This means that the sensor is separated by implantation processes into two differently doped regions 120a, b, at the boundary layer 122 of which a temperature-sensitive diode forms.

Figure 2D:
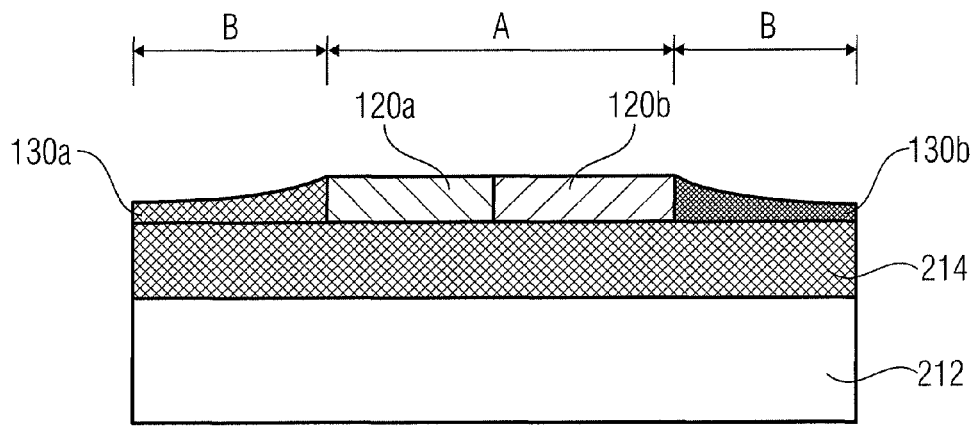

FIG. 2d shows how amorphization of the semiconductor material 120 is performed in a subsequent step along the thinned regions B (contact regions), and how a first edge region 130a which is in contact with the first doped region 120a, and additionally a second edge region 130b which is in contact with the second doped region 120b form. Amorphization may exemplarily be performed by argon implantation, thereby disturbing the silicon crystal, the result being a polycrystalline or amorphous silicon. The argon implantation may be performed for both the boron-implanted and for the phosphorous-implanted areas. Correspondingly, the n-conducting semiconductor becomes amorphous and the p-conducting semiconductor also becomes amorphous. The result is that the thermal conductivity of the sensor element is again reduced considerably along the edge regions B and thus the thermal insulation of the membrane 110 to spacers to be formed later on is improved further. The edge regions B may exemplarily keep their p-type or n-type characteristic, the reduction in thermal conductivity being obtained by amorphization of the material (disturbance or damage of the grid structure). Instead of the argon implantation exemplarily mentioned, amorphization may also use a different ion implantation (such as using another non-doped inert gas).

Figure 2E:
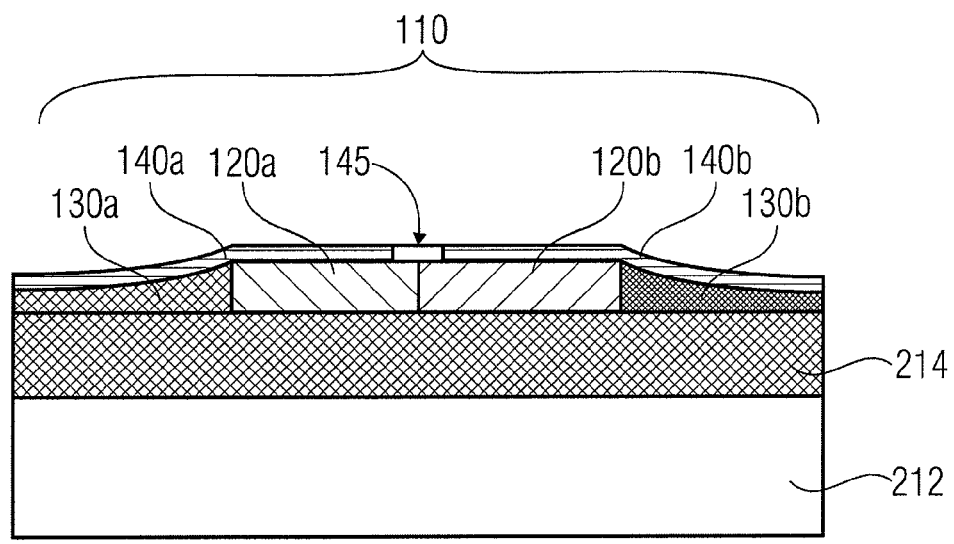

FIG. 2e shows how, in a subsequent process, a first conductive layer 140a is formed on the first edge region 130a and the first doped region 120a, and, additionally, a second conductive layer 140b is formed on the second doped region 120b and the second edge region 130b. The first and second conductive layers 140a, b here are electrically insulated from each other by a gap 145, the gap 145 being formed along the p-n junction 122 (transition between the complementarily doped regions 120a, b).

The conductive layer 140a, b on the one hand avoids reflection on the bolometer layer 110 and thus results in the greatest absorption possible. In order to achieve this, large parts of the sensor are provided with the conductive layer 140 (such as, for example, a thin metal film), the gap 145 ensuring electrical insulation over the entire sensor area. Titanium nitride may exemplarily be used as the material for the conductive layer 140. Additionally, it is optionally also possible for an insulating layer to be formed partly both above and below the conductive layer 140, so as to protect the layers shown from degradation on the surrounding air or etching attack during the further process procedure.

Apart from the insulating layer, an additional insulating layer may be formed in the layer sequence shown between the conductive layer 140 and the semiconductor layers 120, 130, wherein, however, the conductive layer 120 is advantageously formed to be electrically contacted with the complementarily doped regions 120a, b. The optional insulating layers may exemplarily comprise a silicon nitride or silicon oxide or intrinsic amorphous silicon.

Since amorphization of the edge regions 130a, b results in the conduction band structures of the semiconductor material to be damaged, the conductive layer 140 is to electrically contact the complementarily doped regions 120a, b so as to realize the best possible electrical conductivity or electrical feed. This allows electrically bridging the edge regions 130 which are of poor conductivity as a consequence of amorphization so that the production of heat resulting from an increased ohmic resistance can be avoided.

Figure 2F:
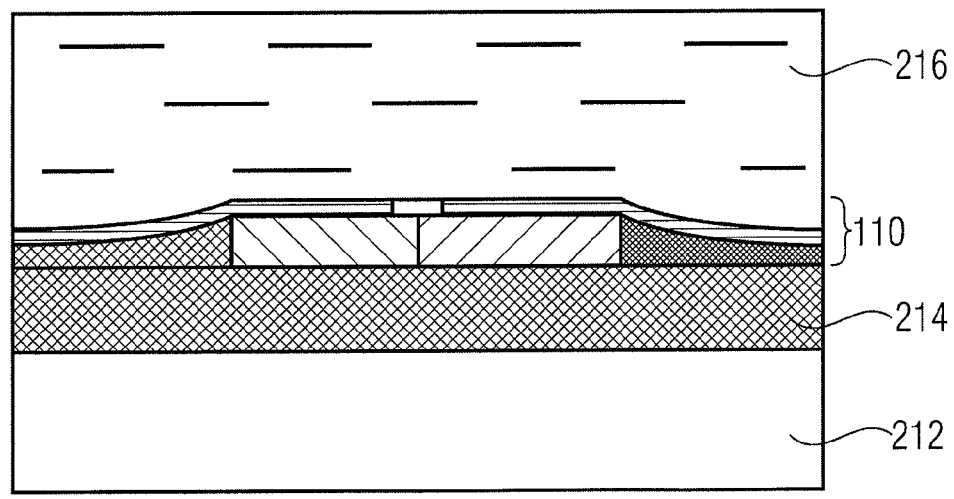

FIG. 2f shows a subsequent step where a connection layer (bond layer) 216 is formed on the conductive layer 140 (the optional insulating layers will not be shown below), wherein the connection layer 216 is used for the subsequent bonding process to the circuit wafer and additionally serves as sacrificial material so as to adjust the predetermined distance D for the bolometer.

In a final process sequence, the sensor wafer, as is shown in FIG. 2e, is provided with a layer 216 to be bonded, wherein the layer 216 to be bonded may exemplarily comprise a silicon oxide, spin-on glass, amorphous silicon or, maybe, an adhesive intermediate layer made of polyimide or BCB, and is connected with a second wafer with the top side facing down. The connection is thus done along the exemplary bond layer 216, wherein the second wafer (circuit wafer) also comprises a bondable layer, along which the bonding process may take place. The inactive part of the sensor wafer (i.e. the oxide layer 214 or the buried oxide and the exemplary silicon substrate 212) may exemplarily be removed by grinding or by selective etching.

Metal contacts are produced by suitable etching and/or cutting processes through the intermediate layers (bond layer 216) connecting the wafers (sensor wafer and circuit wafer). Additionally, the bolometer geometry (see FIG. 4 below) is realized. After that, the intermediate layers (bond layers 216) no longer required are removed selectively, the result being a membrane 110 suspended above the circuit wafer (see FIG. 1).

Figure 3A:
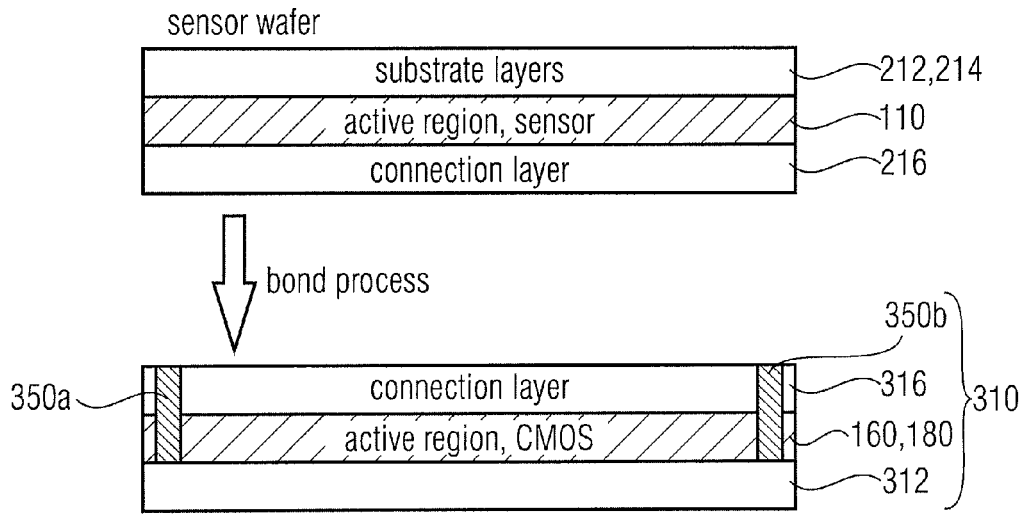
FIGS. 3a,b show basic illustrations of the wafer bonding process.

FIGS. 3a, b show further processing after finishing the sensor wafer and providing a circuit wafer 310 (circuit substrate).

FIG. 3a at first shows the bonding process wherein the sensor wafer is connected with the circuit wafer 310 using a bonding process. The sensor wafer comprises the structure as is shown in FIG. 2f: the connection layer 216, the membrane 110 (active region, sensor) and a bulk region (the oxide layer 214 and the substrate 212). The circuit wafer 310 also comprises a substrate 312 which is followed by an active region (exemplarily a CMOS circuit) on which finally a connection layer (bond layer) 316 is formed. In the bonding process, the bond layer 216 of the sensor wafer is combined with the connection layer 316 of the circuit wafer 310. The contact regions 350 where the active region is contacted with the exemplary CMOS circuit may exemplarily be formed before the bonding process. This may exemplarily be performed by forming openings (such as, for example, by means of etching) in the connection layer 316 of the circuit wafer 310, which may optionally be filled with a conductive material.

Figure 3B:
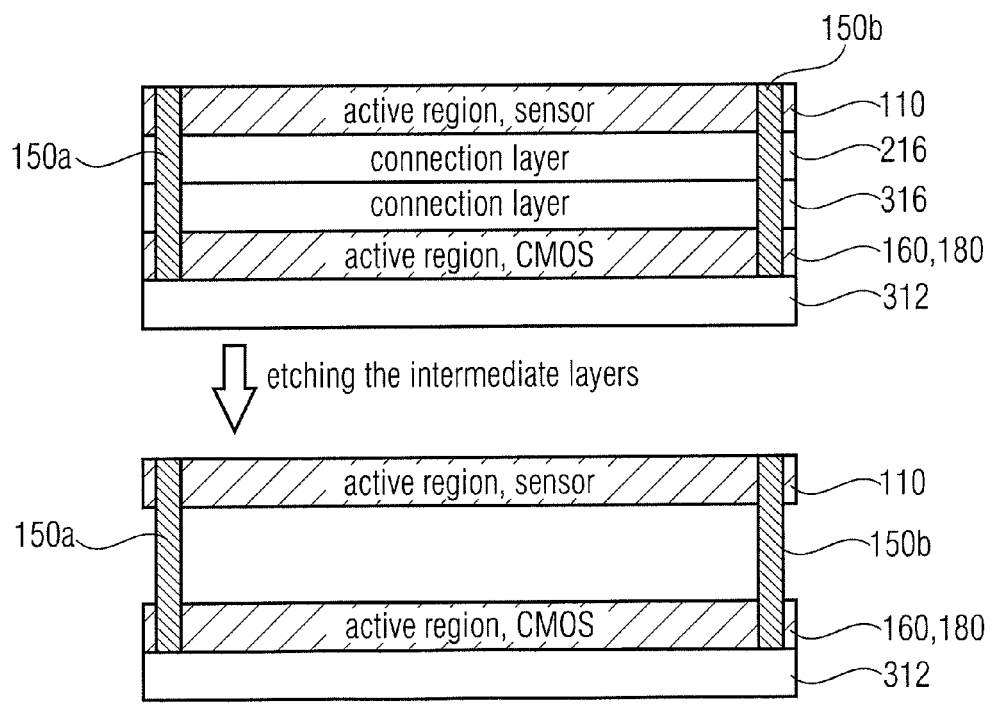

FIG. 3b in the top part at first shows the result of the bonding process as is shown in FIG. 3a. After the bonding process, a layer sequence where the connection layer 216 of the sensor wafer is in contact with the connection layer 316 of the circuit wafer 310 results, such that the membrane 110 (sensor) is separated from the active region (CMOS circuit and underlying substrate 160) by the two connection layers 216 and 316.

After the bonding process, the contact regions 350 of the circuit wafer 310 may exemplarily be opened by an etching process through the membrane 110 and the bond layer 216 of the sensor wafer and be filled with a conductive material, the result being the spacers 150a, b. Before forming the spacers 150a, b, the bulk region of the sensor wafer including the oxide layer 214 and the substrate 212 may exemplarily have been removed from the sensor wafer, so that the membrane 110 (active region) is exposed.

In a final process step, the bond layers 216, 316 are exemplarily removed by etching so that the membrane structure results where the active sensor region A as the membrane 110 is kept above the underlying substrate 160 by the two spacers 150a, b (see FIG. 1).

Before the bonding process, as is shown in FIG. 3a, the metal contacts 350a, b which ensure contacting of the exemplary CMOS circuit (evaluating unit 180) may be formed on the circuit wafer. The bond layers 216 and 316 may exemplarily comprise an oxide, silicon or polymer. The bulk region (inactive region of the substrate layers 212 and 214) may exemplarily also be removed by selective etching and forming the spacers 150a, 150b may exemplarily include etching so as to form contact holes (openings) through the bond layer 216 and the membrane 110 and subsequently filling the contact holes with a conductive material. Additionally, an etching step which defines the bolometer geometry may take place (see FIG. 4).

The bonding process described need not necessarily be performed using wafers, but may also be performed for substrates, i.e. the membranes comprising a bond layer, and a circuit substrate are bonded.

This means that there are a number of different specific ways of performing the processing shown. As has been mentioned, silicon may exemplarily be used as the sacrificial layer (bond layers 216, 316), wherein in this case the active parts of the sensor are to be protected by an etch barrier. Further ways of realizing this are (potentially combined) usage of other intermediate layers and primers (silicon oxides, polymers). Connecting the sensor and circuit wafers 310 in the end is done only via thin metal posts (spacers 150). A large part of the pixel element has the function of an optically adapted absorber (for the infrared radiation to be detected). The edge regions B are thin and made up of a non-single-crystalline material (amorphized) and thus represent an effective thermal resistance. Actually measuring the temperature of the pixel element is done using the temperature dependence of the electrical resistance of the diode (p-n junction) in the central region of the sensor.

Figure 4:
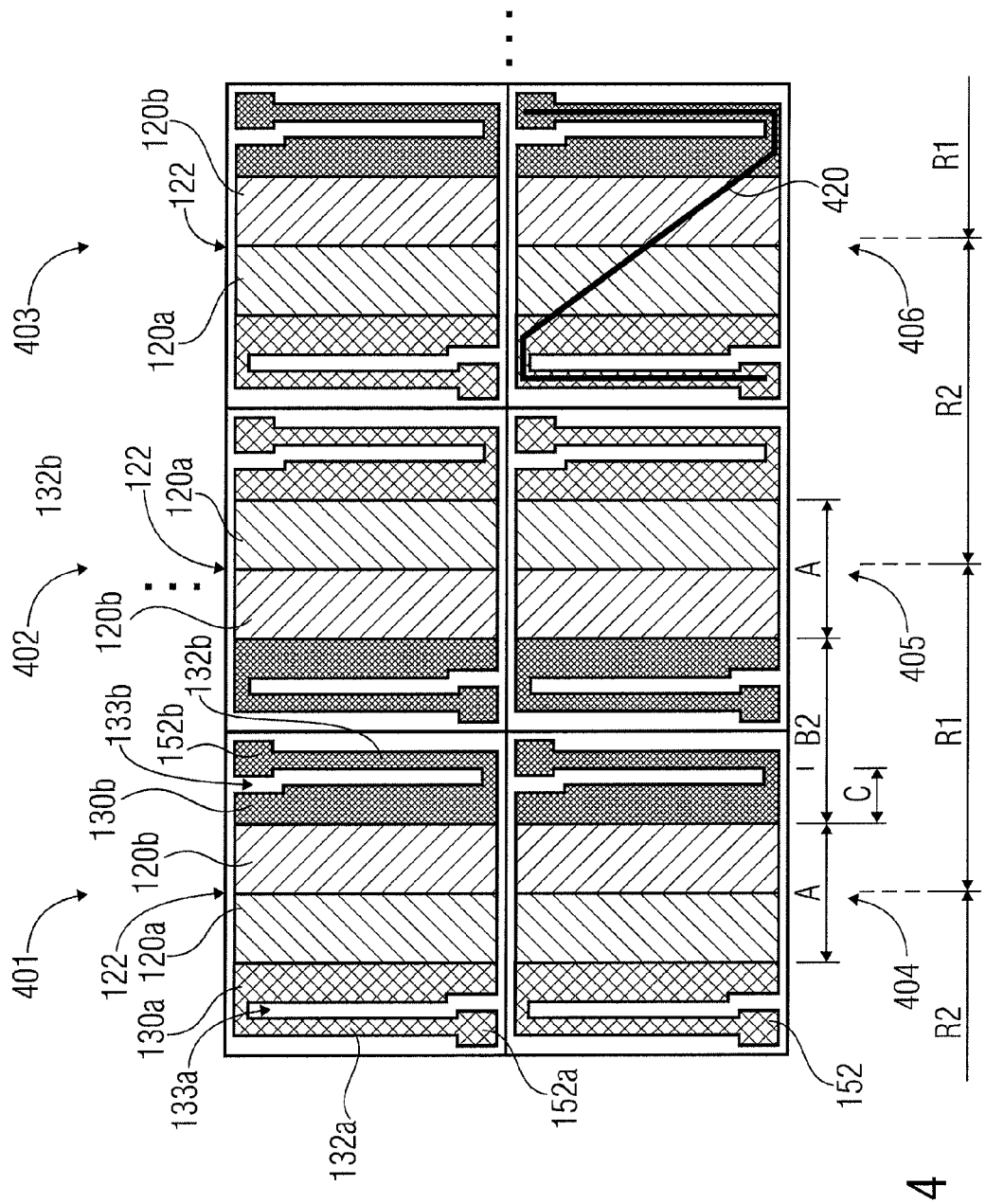
FIG. 4 shows a top view of a sensor array of, for example, 6 pixels.

FIG. 4 shows a top view of a bolometer sensor array which exemplarily comprises six pixel elements 401, 402, 403, . . . , 406. The cross-sectional views of FIGS. 1 to 3 are along the cross-section line 420 which is illustrated in the sixth pixel element 406. The pixel array shown made of six elements may optionally continue in both a horizontal and a vertical direction, the result being an infrared sensor comprising the desired resolution (number of pixels). It is also possible to realize a row array by horizontal or vertical arrangements of a plurality of bolometers.

As can be seen in the top view of FIG. 4, each pixel element comprises the two complementarily doped regions 120a, b, the p-n junctions 122 in the illustration shown extending along the vertical direction. Respective complementarily doped regions 120a, b extend laterally perpendicularly to the vertically arranged p-n junctions 122 and, after that, the edge regions 130a, b having been produced by amorphizing the single-crystalline semiconductor material. The first edge region 130a makes contact to a first contact region 152a via a land 132a. In analogy, the second edge region 130b makes contact to the second contact region 152b via a second land 132b. The lands 132a, b here are exemplarily parallel to the p-n junctions 122 and are separated from the sensor regions A of the membrane 110 by small gaps 133a, 133b.

The etching steps mentioned before for defining the bolometer geometry include, on the one hand, defining the individual pixel elements 401, . . . , 406, and forming the gaps 133 and the lands 132 which serve for improved thermal insulation of the membrane 110, so that the measurement performed along the p-n junctions 122 is in the best way possible insulated thermally from the contact regions 152. The spacers 150 are either formed in the contact regions 152 later on or contact same only from below, such that they are not to be seen in FIG. 4.

In accordance with the invention, there is an alternating sequence of p-type and n-type doped regions in the sequence of pixel elements 401, 402, 403, . . . . This means: if the first doped region 120a (in the first sensor cell 401 of the illustration shown) includes an n-type doped region and the second doped region 120b a p-type doped region, the p-type doped region in the second sensor cell 402 is arranged on that side facing the first sensor cell 401, and the n-type doped region is arranged on that side facing the third sensor cell 403. In FIG. 4, the following doping sequence results from the left to the right: in the first sensor cell, the region 120a is arranged followed by the second region 120b, and in the second sensor cell 402, the second region 120b and then the first region 120a, and finally in the third sensor cell 403, as is the case in the first sensor cell 401, at first the first region 120a and then the second region 120b. This, when processing the sensor wafer, allows choosing equal doping in a first doping region R1 between the p-n junction 122 of the first and second sensor elements 401, 402 and choosing complementary doping in a second doping region R2 between the p-n junction of the second sensor element 402 and the p-n junction 122 of the third sensor element 403. This doping sequence may continue in a horizontal direction for the entire wafer. The advantage of this is that dopings here can be produced over large areas and dopings need not change in a vertical direction. The fourth sensor element 404 thus comprises the same doping sequence (first region 120a left and second region 120b right) as the first sensor element 401, and the fifth sensor element 402 comprises the same dopings as the second sensor element 402. The doping sequence selected in this way generally means that vertically neighboring bolometers (sensor elements) comprise equal doping profiles and horizontally neighboring bolometers comprise complementary doping profiles.

When there are dopings, the amorphized edge regions along the areas B2 may be formed in a subsequent step between the sensor areas A which extend symmetrically around the p-n junctions 122. After amorphizing the edge regions B2, patterning may finally be performed, for example by etching processes, as is illustrated above, lands 132 and gaps 133 being generated here. However, this etching process is only performed after bonding the sensor wafer to the circuit wafer 310 which in the illustration shown here is arranged below the sensor wafer.

After the bond process, the contact regions 152 may be opened using an etching process so that metallic contacting to the underlying metal contact 350 of the evaluating circuit 180 is possible and the spacers 150 form.

Doping, including thermal annealing, generally represents a high-temperature process which would have negative impacts on an evaluating circuit 180. Thus, the process procedure shown here is of advantage, where at first the sensor membrane is processed separately and in the course of which the doped regions 120 are formed. These high-temperature processes are thus performed in a separate wafer which has no contact to the circuit wafer yet.

FIG. 4 thus shows the lateral geometry of the sensor element in a top view, the section of the previous illustration also being indicated. The processing chosen usually is not done using a single sensor, but, for realizing a high-resolution camera for example, in the form of a so-called pixel array (such as, for example, 640×480). The process procedure presented here is thus additionally of advantage in that only low demands are needed regarding the spatial precision of aligning the individual structures to one another. Doping the individual regions may exemplarily take place using broader strips (such as, for example, between the p-n junction 122 of the first sensor element 401 and the p-n junction 122 of the second sensor element 402). In this way, vertical misaligning does not interfere with the functioning of the device (since the sensor pixels arranged vertically to one another comprise the same doping sequence). In the horizontal direction, too, there is a tolerance sufficient for current manufacturing technology.

Thermal insulation is, as described before, done by thin lands 132 at two respective sides of each pixel 401, 402, . . . . This type of process procedure allows the lands 132 to be thinner than the central region of the pixel (which is basically given by the sensor area A). In addition, the semiconductor material along the lands 132 is formed to be amorphous. These two features allow decreasing the thermal conductivity considerably compared to homogenous single-crystalline sensors—without having a negative influence on the optical features of the system or the area requirements.

Phosphorus doping along the first doping area R1 (implantation area) which is followed by an exemplary boron doping in the second doping area R2 may, for example, be done. These alternating dopings are continued in the horizontal direction—however remain the same in the vertical direction. In each of the doping regions R1, R2, the edge regions B2 in which argon implantation, for example, is performed are formed to be as well-centered as possible so that the single-crystalline semiconductor material becomes amorphized there. A horizontal tolerance region C when amorphizing on the one hand ensures that amorphous semiconductor material will be present along the lands 132 in any case, and on the other hand, that a p-n junction 122 forms in the center of the sensor area A. Since the doping does not change in the vertical direction, there is also aligning tolerance. It is to be kept in mind that amorphization in the regions B2 is done by implanting an exemplary inert gas, such as, for example, argon, so that the semiconductor material there comprises both phosphorus or boron and argon atoms. The p-type or n-type doped region is thus amorphized directly.

Embodiments may finally be summarized as follows. The bolometer comprises, as essential structural features, a single-crystalline sensor fixed by amorphous and thinned edge regions (lands 132). An aligning tolerance which is of advantage in particular when processing high-resolution pixel arrays results by the doping profile shown in FIG. 4. In addition, adjusting the sheet resistance and characteristic impedance via the conductive layer 140 is possible.

Embodiments of the present invention may thus be defined as follows. A diode bolometer array comprises single-crystalline lateral diodes which are suspended on two posts (spacers 150) above a CMOS readout circuit (readout circuit 180) by a suitable bonding process using an isotropic etching step. Optionally, the diode additionally comprises a titanium nitride layer 140 which may exemplarily be used for setting the overall sheet resistance to 377 Ohm/sq ("sq" here refers to the area, or more precisely to the ratio of length and width of the area). This conductive layer 140 is interrupted only at a narrow position 145. This position may be directly above the p-n junction of the diode or—when using an insulating intermediate layer (such as, for example, made of silicon oxide, silicon nitride etc.)—be arranged at any other location. In embodiments, the edge regions 130 are amorphized so as to achieve improved thermal insulation along the contact arms (lands 132). Additionally, the contact arms may optionally be thinned by an exemplary LOCOS process, which also decreases thermal conductivity.

With regard to aligning freedom, the inventive processing is of an optimized layout as is shown in FIG. 4. Aligning freedom here does not only refer to the processing of the membrane (such as, for example, when doping, amorphizing, patenting, etc.), but also to the process of wafer bonding (manufacturing a wafer compound) which often comprises an aligning imprecision of, for example, 5 µm. The optimized layout wherein horizontally neighboring pixels will comprise mutually exchanged p/n sides allows secure wafer bonding. The wafer compound may exemplarily comprise an imprecision which is within the tolerance region C in FIG. 4, without impeding the wafer compound. Wafer bonding could hardly be realized using a conventional layout.

Additionally, in the inventive process procedure, an insulation layer can be introduced between the single-crystalline semiconductor material 120 and the reflection-reducing conductive layer 140. It is also possible for the conductive layer 140 itself to be covered by such an insulation layer. As has been discussed in detail, there are different ways of bonding the two wafers, these being direct bonding, bonding using organic and inorganic intermediate layers, or also using other bond materials. It is important for the bond process for all the high-temperature processes to be performed on the membrane, to be preformed before bonding, so that an evaluating circuit 180, which may be located in the underlying substrate 160, not be damaged by the high-temperature processes. This is particularly important since the evaluating circuit 180 should, if possible, be arranged below the membrane 110 such that the sensor array is of the most compact shape possible and no circuit to be arranged laterally is required.

The embodiments presented here comprise a membrane which, together with a reflecting underground, forms a strongly absorbing resonator structure. The sensor membrane here serves as an absorber and is heated directly by radiation. This is of advantage in that implanting an additional absorbing structure (such as, for example, another thermally coupled membrane) can be dispensed with here, which would partly be complicated to realize from a technological point of view and frequently degrades the features of the entire structure. Consequently, embodiments combine the electrical advantages of a diode bolometer and excellent optical features and low thermal mass in a novel manner.

Above embodiments relate, among other things also, to a bolometer array comprising a plurality of bolometers in accordance with one of the preceding embodiments, which are arranged to be vertically and/or horizontally neighboring, the complementarily doped regions 120a, 120b being formed to be neighboring in a horizontal direction. Vertically neighboring bolometers here may exhibit equal doping profiles and horizontally neighboring bolometers exhibit complementary doping profiles.

However, above embodiments also relate to a method for producing a bolometer comprising forming a semiconductor membrane 110 having a single-crystalline portion 120; forming a bond layer 216 on the semiconductor membrane 110; providing a circuit substrate 310 having an evaluating circuit 180; bonding the semiconductor membrane 110 and the circuit substrate 310 along the bond layer 216; forming spacers 150; and removing the bond layer 216. The step of forming the semiconductor membrane 110 here may include the following steps, namely providing a layer stack having a single-crystalline semiconductor layer 210, an oxide layer 214 and a substrate layer 212; thinning the single-crystalline semiconductor layer 210 along edge regions; doping the single-crystalline semiconductor layer 210 so as to generate complementarily doped regions 120a, 120b; amorphizing the thinned edge regions; and forming a conductive layer 140 on the edge regions B and, partly, on the complementary doped regions 120. Thinning here may be done by a LOCOS process, and/or the method may additionally comprise the step of forming an insulating layer, the insulating layer being formed between the conductive layer 140 and the edge regions 130 or between the conductive layer 140 and the complementarily doped regions 120. In addition, forming another insulation layer may be provided for, the other insulation layer being formed on the conductive layer 140. Forming the conductive layer 140 may be done using such a layer thickness that the semiconductor membrane 110 exhibits, as sheet resistance, the characteristic impedance of infrared radiation in air. Amorphizing may include ion implantation. Forming the semiconductor membrane 110 may include forming a sensor wafer, a plurality of semiconductor membranes being arranged on the sensor wafer such that neighboring bolometer elements comprise an equal doping profile in a lateral direction and a complementary doping profile along a lateral direction perpendicular thereto. Finally, providing a circuit substrate may include providing a circuit wafer comprising a plurality of evaluating circuits and bonding may include a wafer bonding process so that each semiconductor membrane is electrically connected to a respective evaluating circuit.

While this invention has been described in terms of several embodiments, there are alterations, permutations and equivalents which fall in the scope of this invention. It should also be noted that there are many alternative ways of implementing the illumination apparatus and the illumination system as described herein. It is therefore intended that the following depending claims are interpreted as including all such alterations, permutations and equivalents as fall within the true spirit and scope of the present invention.

The invention claimed is:

1. A bolometer array comprising pixel elements arranged in columns and rows, each one thereof forming a bolometer, comprising:
   an underlying substrate;
   a semiconductor membrane per pixel element, comprising a single-crystalline portion, wherein complementarily doped regions of the single-crystalline portion form a diode and a p-n junction extends between same along a column direction, pixel elements neighboring in the column direction exhibiting equal doping profiles; and a first and a second spacer per pixel element so as to keep the semiconductor membrane at a predetermined distance from the underlying substrate, wherein the predetermined distance corresponds to a fourth of an infrared wavelength, wherein a first and a second edge region via which the semiconductor membrane contacts the spacers and which comprise lands for thermal insulation of the semiconductor membrane, follow the complementarily doped regions laterally on both sides of the p-n junction in each pixel element, and wherein the bolometer additionally comprises an evaluating circuit for each pixel element and at least part of the evaluating circuit is arranged in the underlying substrate laterally between the first and second spacers;

wherein in each pixel element the semiconductor membrane additionally comprises a first and a second conductive layer which are electrically insulated from each other by a gap;

wherein the first conductive layer contacts the first doped region and the second conductive layer contacts the second doped region, and wherein the gap is formed along the p-n junction between the complementarily doped regions.

2. The bolometer array in accordance with claim 1, wherein additionally an intrinsic region formed laterally along the semiconductor membrane between the complementarily doped regions is provided per pixel element so that the single-crystalline portion forms a PIN diode.

3. The bolometer array in accordance with claim 1, wherein the underlying substrate comprises a reflection layer such that incident infrared radiation is reflectable on the reflection layer in the direction of the semiconductor membrane.

4. The bolometer array in accordance with claim 1, wherein the complementarily doped regions form a sensor area and additionally serve as an absorption medium for the incident infrared radiation.

5. The bolometer array in accordance with claim 1, wherein the complementarily doped regions are arranged on a side of the conductive layer facing away from the underlying substrate.

6. The bolometer array in accordance with claim 1, wherein the conductive layer is implemented such that the semiconductor membrane comprises a sheet resistance between 200 ohm/square area and 700 ohm/square area.

7. The bolometer array in accordance with claim 1, wherein the first and second edge regions comprise an amorphized doped semiconductor material.

8. The bolometer array in accordance with claim 1, wherein the lands comprise a reduced layer thickness compared to the semiconductor membrane.

9. The bolometer array in accordance with claim 1, wherein gaps are formed between the lands and the doped regions.

10. The bolometer array in accordance with claim 1, additionally comprising an insulation layer, wherein the insulation layer is arranged between the conductive layer and the complementarily doped regions or is formed on the semiconductor membrane.

11. The bolometer array in accordance with claim 1, wherein in each pixel element the lands are parallel to the p-n junction.

12. The bolometer array in accordance with claim 1, wherein the edge regions are arranged to be centered between the p-n junctions of pixel elements neighboring in the row direction.

13. The bolometer array in accordance with claim 1, wherein pixel elements neighboring in the row direction comprise complementary doping profiles.

14. A bolometer comprising:
an underlying substrate;
a semiconductor membrane comprising a single-crystalline portion; and
a spacer so as to keep the semiconductor membrane at a predetermined distance from the underlying substrate,
wherein complementarily doped regions of the single-crystalline portion form a diode and the predetermined distance corresponds to a fourth of an infrared wavelength,
wherein the semiconductor membrane contacts the spacers via a first and a second edge region which comprise lands for thermal insulation of the semiconductor membrane,
wherein the first and second edge regions comprise an amorphized doped semiconductor material, and
wherein the bolometer additionally comprises an evaluating circuit and at least part of the evaluating circuit is arranged in the underlying substrate laterally between the first and second spacers.

15. A bolometer comprising:
an underlying substrate;
a semiconductor membrane comprising a single-crystalline portion; and
a spacer so as to keep the semiconductor membrane at a predetermined distance from the underlying substrate,
wherein complementarily doped regions of the single-crystalline portion form a diode and the predetermined distance corresponds to a fourth of an infrared wavelength,
wherein the semiconductor membrane contacts the spacers via a first and a second edge region which comprise lands for thermal insulation of the semiconductor membrane,
wherein the first and second edge regions comprise an amorphized doped semiconductor material,
wherein the bolometer additionally comprises an evaluating circuit and at least part of the evaluating circuit is arranged in the underlying substrate laterally between the first and second spacers, and
wherein the single-crystalline portion comprises complementarily doped first and second regions forming a diode, and the semiconductor membrane further comprises first and second conductive layers electrically separated from each other with the first conductive layer contacting the first doped region and the second conductive layer contacting the second doped region so that a p-n junction of the diode extends between the first and second conductive layers.

16. A bolometer array comprising pixel elements arranged in columns and rows, each one thereof forming a bolometer, comprising:
an underlying substrate;
a semiconductor membrane per pixel element, comprising a single-crystalline portion, wherein complementarily doped regions of the single-crystalline portion form a diode and a p-n junction extends between same along a column direction, pixel elements neighboring in the column direction exhibiting equal doping profiles; and
a first and a second spacer per pixel element so as to keep the semiconductor membrane at a predetermined distance from the underlying substrate,
wherein the predetermined distance corresponds to a fourth of an infrared wavelength, wherein a first and a second edge region via which the semiconductor membrane contacts the spacers and which comprise lands for thermal insulation of the semiconductor membrane, follow the complementarily doped regions laterally on both sides of the p-n junction in each pixel element, and wherein the bolometer additionally comprises an evaluating circuit for each pixel element and at least part of the evaluating circuit is arranged in the underlying substrate laterally between the first and second spacers;

wherein in each pixel element the semiconductor membrane additionally comprises first and second conductive layers which are electrically separated from each other with the first conductive layer contacting the first doped region and the second conductive layer contacting the second doped region so that the first and second conductive layers are separated from each other along the p-n junction between the complementarily doped regions.

* * * * *